(12) United States Patent
Jong et al.

(10) Patent No.: US 6,348,381 B1
(45) Date of Patent: Feb. 19, 2002

(54) METHOD FOR FORMING A NONVOLATILE MEMORY WITH OPTIMUM BIAS CONDITION

(75) Inventors: Fuh-Cheng Jong, Tainan; Kent Kuohua Chang, Taipei, both of (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 09/788,372

(22) Filed: Feb. 21, 2001

(51) Int. Cl.$^7$ ............................................. H01K 21/8247
(52) U.S. Cl. ................................... 438/261; 365/185.28
(58) Field of Search .............. 365/185.28; 438/257–267

(56) References Cited

U.S. PATENT DOCUMENTS

| | | | |
|---|---|---|---|
| 5,966,603 A | | 10/1999 | Eitan |
| 6,044,022 A | * | 3/2000 | Nachumovsky ........ 365/185.28 |
| 6,181,597 B1 | * | 1/2001 | Nachumovsky ........ 365/185.03 |
| 6,269,023 B1 | * | 7/2001 | Deracobian et al. ... 365/185.24 |

OTHER PUBLICATIONS

"A true Single–Transistor Oxide–Nitride–Oxide EEPROM Device," By T. Y. Chan, K. K. Young, and Chenming Hu in IEEE EDL–8, No. 3, pp. 93–95, March 1987.

* cited by examiner

Primary Examiner—Richard Booth

(57) ABSTRACT

A method for forming a nonvolatile memory with optimum bias condition is disclosed. Initially, an ONO structure is formed on the substrate wherein the ONO structure has a first oxide layer, a nitride layer and a second oxide layer. Afterwards, a plurality of openings is formed on the ONO structure and a portion of substrate is exposed. An optimum condition of a nonvolatile memory cell having a threshold voltage region wherein the threshold voltage region can be optimum by adjusting a lateral electric field between a drain and a gate to transfer a plurality of electrons into the ONO structure. Thereafter, an implant process is performed to form a plurality of bit lines on substrate. An oxide layer is formed on bit lines to create a bit lines oxide layer. Finally, a polysilicon is formed on bit lines oxide layer and the ONO structure to produce the nonvolatile memory cell. Alternatively, after a nonvolatile memory cell is made, the optimum threshold voltage region can be selected by adjusting a lateral electrical field between a drain and a gate to transfer a plurality of electrons into the ONO structure.

10 Claims, 3 Drawing Sheets

US 6,348,381 B1

METHOD FOR FORMING A NONVOLATILE MEMORY WITH OPTIMUM BIAS CONDITION

FIELD OF THE INVENTION

The present invention generally relates to a method for fabricating memory, and more particularly, to a method for fabricating a nonvolatile memory cell with optimum bias condition.

BACKGROUND OF THE INVENTION

Since the rapid developments of the semiconductor techniques and widespread application of information products, semiconductor devices play an important role, specifically in the flash memory. This memory has excellent program/erase characteristics and has been a master stream in the nonvolatile memory field. However, taken account of transistor integrity, power consumption, threshold voltage level, and noise reduction thereof, the flash memory generally won't be exactly programmed or erased in the period of data access.

Referring to FIG. 1, the cross-sectional views of the conventional nitride read only memory (NROM), including a nitride layer, as described in U.S. Pat. No. 5,966,603 to Eitan. The nonvolatile memory cell includes an oxide-nitride-oxide (ONO) structure 110, a drain 102 and a gate 112, wherein the ONO structure 110 is composed of a first oxide layer 104, a nitride layer 106 and a second oxide layer 108. In a programming period, a high voltage is put on drain 102 and gate 112 respectively to generate a large amount of electron-hole pairs. Subsequently, several electrons are attracted toward gate 112 by an electrical field in order to be penetrated through the first oxide layer 104 and trapped in the nitride layer 106 for inducing high threshold voltage. In the erasing period, a portion of electrons are removed away from the nitride layer 106, or a portion of holes are injected into nitride layer 106 to be neutralized with the portion of electrons, and hence the remaining electrons part with other portion of holes within the nitride layer 106. As a whole, such neutralization may bring about lower threshold voltage which is defined as minimum gate voltage in response to activating current, typically of 1 $\mu A$, between the source and drain 102.

If the voltage between the drain 102 and gate 112 is not an optimum bias condition, the electric field might vary from the electrons-injected so that an erasing result occurs as a programming action is performed.

Another reference is titled "A true single-transistor oxide-nitride-oxide EEPROM device," by T. Y. Chan, K. K. Young, and Chenming Hu in IEEE EDL-8, No. 3 pp93–95, March 1987. A floating gate is replaced with ONO structure that hot-electrons are used to change the threshold voltage thereof Similarly, if the voltage between the drain 102 and gate 112 is not an optimum bias condition, the electric field might vary from the electrons-injected so that an erasing result occurs as a programming action is performed. For data accessing, such action disagreement will result in data errors or data being lost.

SUMMARY OF THE INVENTION

In view of the problems encountered with the foregoing conventional nonvolatile memory cell, if bias condition of drain/gate of the memory cell is not an optimum value, the expected writing operation of the memory cell may be misused, or the data is wiped out.

As a result, the primary object of the present invention is, after nonvolatile memory cell is made, to provide an optimum bias condition of drain/gate in response to programming or erasing operation, thereby preventing the nonvolatile memory cell from encountering data errors.

Another object of the present invention is, during the fabrication period of the nonvolatile memory cell, in advance, to provide an optimum bias condition in drain/gate to enable a better program operation in the nonvolatile memory cell.

According to the above objects, the present invention sets forth a method of forming an optimum bias condition of the nonvolatile memory cell.

Initially, an ONO structure is formed on substrate wherein the ONO structure has a first oxide layer, a nitride layer and a second oxide layer. Afterwards, a plurality of openings is formed on the ONO structure and a portion of substrate is exposed. An optimum condition of a nonvolatile memory cell having a threshold voltage region wherein the threshold voltage region can be optimum by adjusting a lateral electric field between a drain and a gate to transfer a plurality of electrons into the ONO structure. Thereafter, an implant process is performed to form a plurality of bit lines on substrate. An oxide layer is formed on bit lines to create a bit lines oxide layer. Finally, a polysilicon is formed on bit lines oxide layer and the ONO structure to produce the nonvolatile memory cell. Alternatively, after nonvolatile memory cell is made, the optimum threshold voltage region can be selected by adjusting a lateral electric field between a drain and a gate to transfer a plurality of electrons into the ONO structure. In other words, electrons are injected into the nitride layer in responsive to the expected writing effect.

In summary, the present invention provides a method of forming a nonvolatile memory cell with optimum bias condition by adjusting a voltage between drain and gate. A similar erased region, a second region, can be avoided, but a third region is formed with efficiency. Moreover, the voltage of drain/gate is properly designed to acquire an optimum bias condition such that the nonvolatile memory cell has a correct writing operation.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention is directed to a manner for programming nonvolatile memory cell to improve the drawbacks of the prior art wherein the nonvolatile memory cell preferably comprises EPROM, EEPROM and flash memory.

Figure 1:
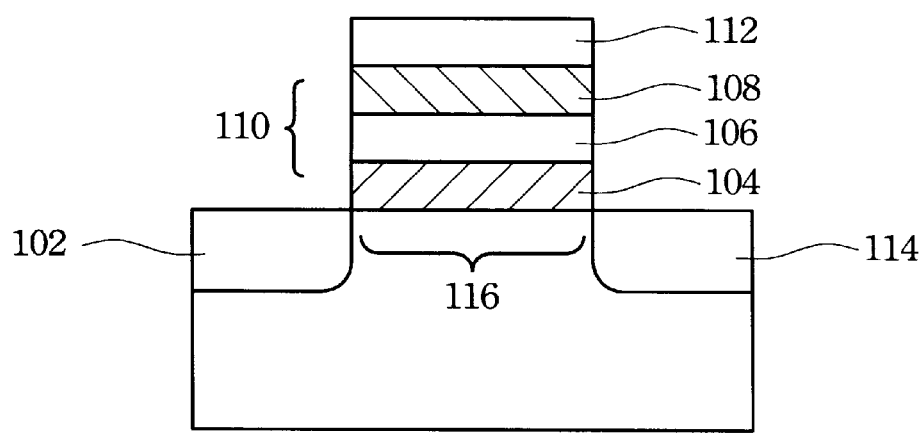
FIG. 1 illustrates a cross-sectional view of a conventional nonvolatile memory cell.
Figure 2:
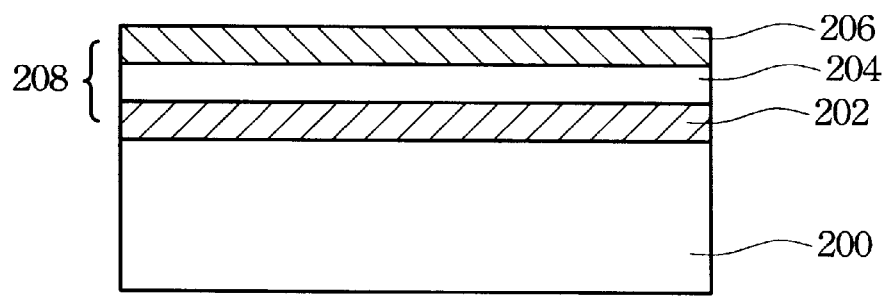
FIGS. 2–7 illustrates cross-sectional views of forming a nonvolatile memory cell with optimum bias condition according to present invention.

Referring to FIG. 2, a first oxide layer 202, a nitride layer 204 and a second oxide layer 206 are sequentially formed on a substrate 200 to create a memory cell having an ONO structure 208. The nitride layer 204, having a thickness between 35 angstroms and 75 angstroms, is sandwiched between the first oxide layer 202, between 50 angstroms and 90 angstroms, and the second oxide layer 206, between 75 angstroms and 115 angstroms. Specifically, the first oxide layer 202 is thinner as far as possible to increase efficiency of electrons injected into the nitride layer 204, preferably 70 angstroms, and the second oxide layer 206 is thicker to reduce the diminishing electron-hole pairs.

Figure 3:
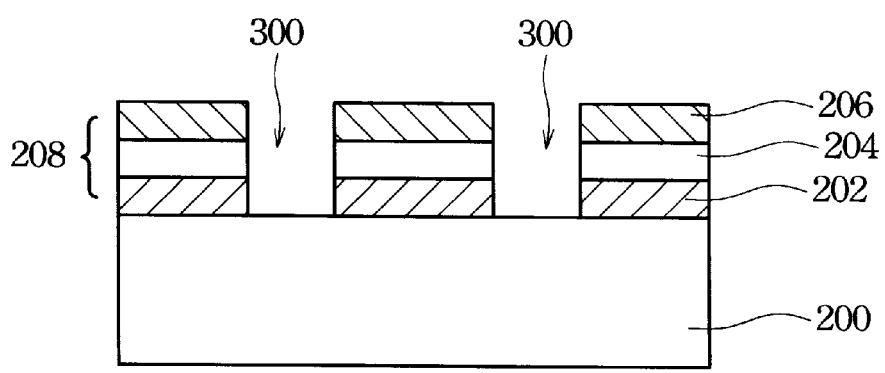

Referring to FIG. 3, a plurality of openings are formed on the ONO structure 208 by a photolithography and etching process, and a portion of substrate 200 is exposed. Thereafter, a photo resistant pattern is formed over the ONO structure 208 by a photolithography process. Using the photo resistant layer as an etching mask, a plurality of openings is formed inside the ONO structure 208 and a portion of substrate 200 is uncapped.

Figure 4:
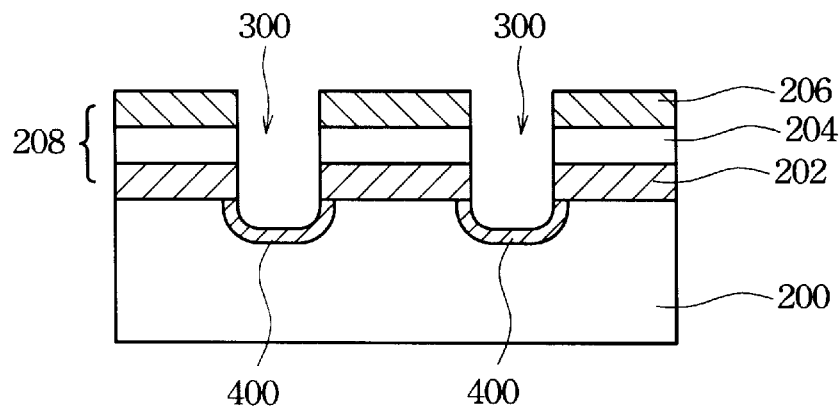

Referring to FIG. 4, an implant step is carried out to form bit lines 400. After the dopant is ionized, the concentration of the dopant is precisely controlled so that the ionized dopant is speeded up by an accelerator device, and then the ionized dopant is continuously implanted into the portion of substrate 200. In the preferred embodiment of the present invention, the dopant is phosphorous atoms, such as phosphine ($PH_3$), implanted into the substrate 200 to form bit lines 400.

Figure 5:
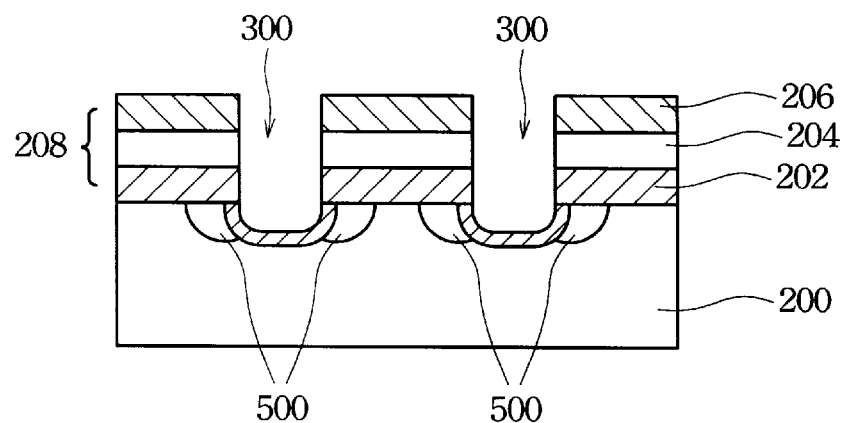

Referring to FIG. 5, a p-pocket region 500 is formed inside bit lines 400 by an implant process to enhance the lateral electrical field through a channel near the drain. The lateral electrical field is able to employ enough energy on the electrons for improving the programmed efficiency and increasing the strength against the punch-through phenomenon induced by higher voltage.

Figure 6:
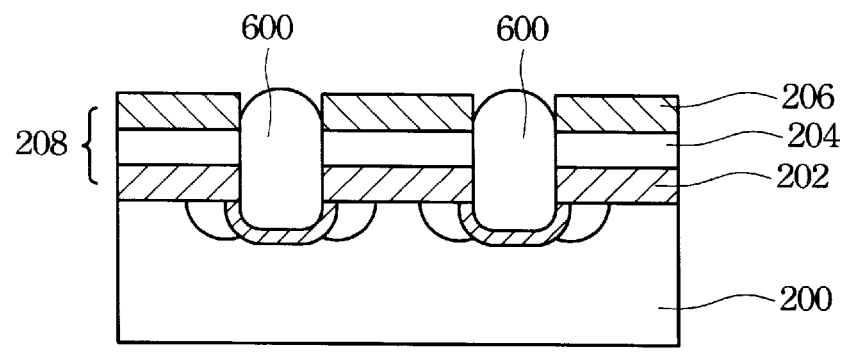

Referring to FIG. 6, after the photo resistant layer is stripped away, the oxide 600 is formed on bit lines 400 by thermal oxidation for constructing a bit line oxide layer.

Figure 7:
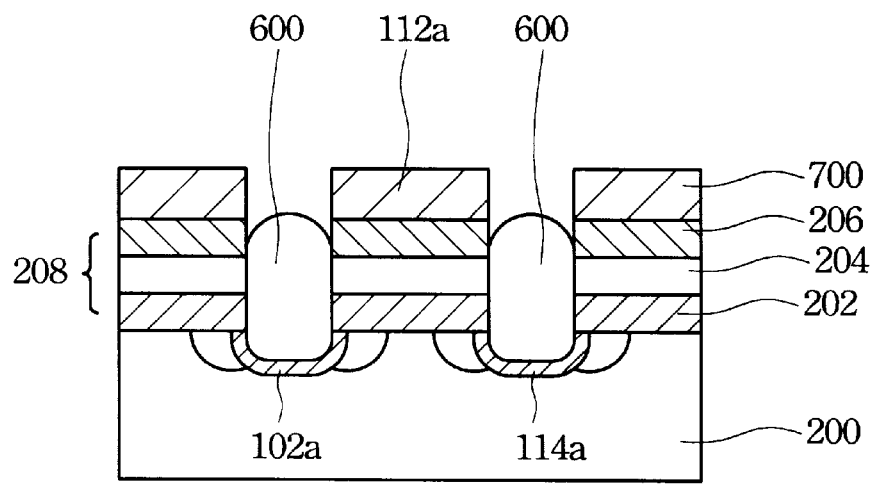

Referring to FIG. 7, a polysilicon layer 700 is formed on oxide layer 600 and the ONO structure 208, wherein the oxide may be used to isolate the ONO structure to fabricate the nonvolatile memory cell.

Specifically, some experimental results with respect to the nonvolatile memory cell that have ONO structure 208 is shown as follows:

According to table 1, an input gate 112a voltage from item 1 to item 4 is constant, preferably 7.0 V, and then the input drain 102a voltage is gradually increased from 4.0 V to 6.5 V, which shows that the memory cell is expectantly programmed. Judging from item 1 to item 2, the threshold voltage is an up trend from 4.4 V to 6.55V. This indicates that, in fact, the memory cell is also written. In item 2 to item 4, the threshold voltage from 6.55 V down 6.16V indicates the memory cell to be erased instead. Therefore, an improperly programmed voltage is applied on the drain/gate.

In item 4 to item 5, the input drain 102a voltage is also constant, i.e. 6.5 V, and the input gate 112a voltage is increasing from 7.0 V to 8.0 V for programming the memory cell. Referring to the results, the threshold voltage is an up trend, from 6.16 V up to 6.42 V, shows that the memory cell is really programmed.

From item 5 to item 6, the input gate 112a voltage is always hold at 8 V, and the input drain 102a voltage is increased up to 7.5 V, which indicates the memory cell programmed. This is just opposite, the threshold voltage is a down trend form 6.42 V to 6.3 V, showing that the memory cell is erased.

Finally, from item 6 to item 7, the input drain 102a voltage is increased from 7.0V to 7.5 V, and the input gate 112a voltage is constant, such as 8 V. Correspondingly, the threshold voltage is unstable, from 6.3 V to failure mode it leads to a junction breakdown of the drain.

According to table 2, from item 1 to item 3, the input gate 112a voltage is constant, such as 7 V, and the input drain 102a voltage is an up trend from 4.0 V to 6.0 V, which indicates the memory cell to be programmed. In item 1 to item 2, the threshold voltage is increased from 3.88 V up to 7.625 V to program the memory cell. However, in item 2 and item 3, this is just opposite, the threshold voltage is decreased from 7.625 V to 7.05 V, indicating the memory cell has been erased. As a result, an improper drain/gate voltage imposed on the memory cell will occur. Additionally, during the data-programming or data-erasing procedure, the voltage on source 114a may be zero, larger than zero or in floating status.

In light of the above experimental results for optimizing the bias condition of the nonvolatile memory cell, during a programming period, the drain 102a voltage and the gate 112a voltage is respectively controlled by the electric fields between drain 102a and gate 112a. Therefore, the threshold voltage induced by the drain 102a voltage or the gate 112a voltage can be acquired expectably for programming the memory cell. During an erasing period, the drain 102a voltage and the gate 112a voltage may be controlled by an electric field between drain 102a and gate 112a such that the threshold voltage varies decreasingly from the drain 102a voltage or the gate 112a voltage for the erasing operation. In other words, the gate/drain voltage is held in optimum bias condition so that, as the electrons are injected into or removed from the nitride layer 204, the memory cell could be programmed correctly.

Figure 8:
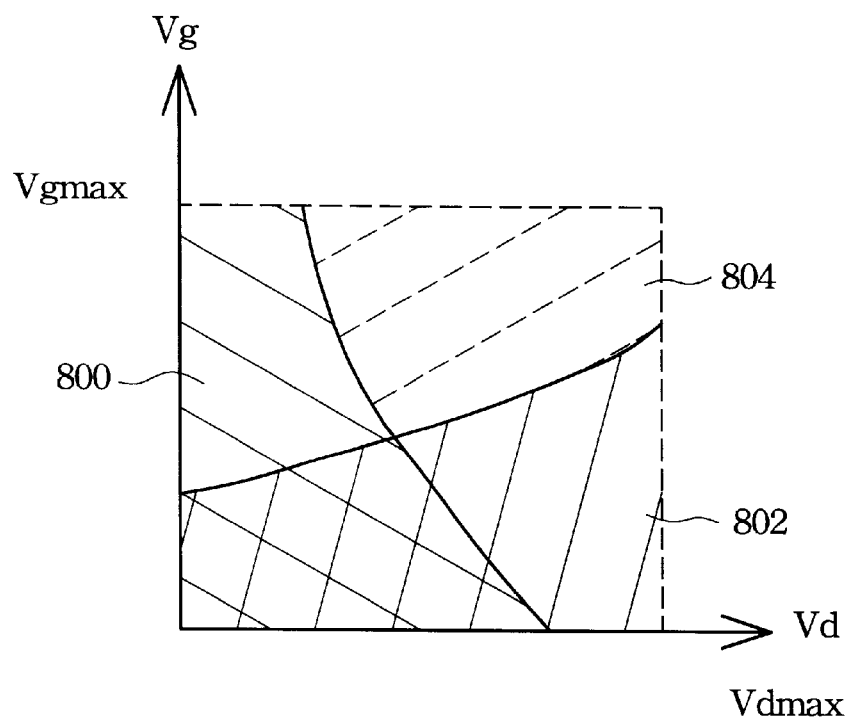
FIG. 8 illustrates diagram of nonvolatile memory cell with optimum bias condition according to present invention.

Referring to FIG. 8, it shows that an optimum bias condition of the nonvolatile memory cell wherein the X-axis and Y-axis are denoted as drain 102a voltage and gate 112a voltage respectively. Furthermore, both junction breakdown and punch-through voltage are used to determine the maximum drain voltage, and voltage-limit diode and gate breakdown voltage is used to determine the maximum gate voltage. Generally, junction breakdown voltage is a voltage between P and N electrode as junction is collapsed, and punch-through voltage is the instant voltage corresponding to the increasing current of channel when the drain voltage increases progressively.

The first region 800 is an inferior writing area since the area is not in saturated status. The second region 802 is an erasing area similar to the electron-removed area. Even if the $V_d$ and $V_g$ of bias condition may induce impact ionization, data-erased. The third region 804 is a superior area since the area is in saturation status so that a large amount of electron-hole pairs are induced to inject into the ONO structure 208. In other words, the efficiency is much better since the ONO structure 208 contains a lot of electrons. In the preferred design of the present invention, by adjusting $V_{dmax}$ and $V_{gmax}$, a third region 804 will be created such that the optimum design of nonvolatile memory cell is obtained.

In the present invention, an optimum bias condition, corresponding to the data-programmed or data-erased, is selected after the nonvolatile memory cell is made whereby preventing the memory cell from data errors. Furthermore, before the memory cell is made, a drain/gate voltage range is acceptably designed. Simultaneously, according to the above experimental results, when the drain 102a voltage or the gate 112a voltage is increased, a proper bias condition will accurately perform a programmed procedure.

In summary, a method of forming a nonvolatile memory cell with optimum bias condition by adjusting a voltage between drain 102a and gate 112a is described. A similar erased region, a second region 802, can be avoided, but a third region 804 is formed with efficiency. Moreover, the voltage of drain/gate is properly designed to acquire an optimum bias condition such that the nonvolatile memory cell has a correct writing operation.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method for forming a nonvolatile memory with optimum bias condition, said method comprising:

providing a substrate;

forming an ONO structure on said substrate wherein said ONO structure has a first oxide layer, a nitride layer and a second oxide layer;

forming a plurality of openings on said ONO structure and a portion of said substrate is exposed;

performing an optimum condition of a nonvolatile memory cell having a threshold voltage region wherein said threshold voltage region can be optimum by adjusting a lateral electric field between a drain and a gate to transfer a plurality of electrons into said ONO structure, and said optimum condition is controlled by a voltage polar and an voltage amplitude control of both said drain and said gate;

performing an implant process to form a plurality of bit lines on said substrate;

forming an oxide layer on said bit lines to create a bit lines oxide layer; and forming a polysilicon on said bit lines oxide layer and said ONO structure to produce said nonvolatile memory cell.

2. The method of claim 1, wherein said nonvolatile memory cell is one selected from one group consisting of EPROM, EEPROM and flash memory.

3. The method of claim 1, wherein said first oxide layer has a thickness between 50 angstroms and 90 angstroms.

4. The method of claim 1, wherein said nitride layer has a thickness between 35 angstroms and 75 angstroms.

5. The method of claim 1, wherein said second oxide layer has a thickness between 75 angstroms and 115 angstroms.

6. The method of claim 1, wherein said optimum condition further comprises said electrons to be programmed into said nitride layer in response to the expected writing effect.

7. The method of claim 1, wherein the maximum voltage of said drain is determined by a junction breakdown voltage and a punch-through voltage.

8. The method of claim 1, wherein the maximum voltage of said gate is determined by said limit-voltage diode and gate breakdown voltage.

9. The method of claim 1, further comprises a p-pocket formed on said bit lines.

10. The method of claim 1, wherein the step of forming said oxide layer on said bit lines comprises thermal oxidation.

* * * * *